United States Patent [19]
Horii et al.

[11] Patent Number: 4,583,179
[45] Date of Patent: Apr. 15, 1986

[54] SEMICONDUCTOR INTEGRATED CIRCUIT

[75] Inventors: Takashi Horii; Tomio Nakano; Masao Nakano, all of Kawasaki; Norihisa Tsuge, Kamakura; Junji Ogawa, Yokohama, all of Japan

[73] Assignee: Fujitsu Limited, Kawasaki, Japan

[21] Appl. No.: 454,254

[22] Filed: Dec. 29, 1982

[30] Foreign Application Priority Data

Dec. 29, 1981 [JP] Japan .................. 56-211399

[51] Int. Cl.[4] ............. G06F 11/30; G11C 11/40; G01R 19/165
[52] U.S. Cl. .................. 364/483; 364/490; 365/200; 371/10; 371/25
[58] Field of Search ............ 365/104, 105, 95, 96, 365/97, 200; 371/8, 10, 20, 23, 25; 364/483, 490, 491

[56] References Cited
U.S. PATENT DOCUMENTS

| | | | |
|---|---|---|---|
| 4,047,163 | 9/1977 | Choate et al. | 365/200 |
| 4,051,460 | 9/1977 | Yamada et al. | 371/10 |
| 4,281,398 | 7/1981 | McKenny et al. | 365/200 |
| 4,346,459 | 8/1982 | Sud et al. | 371/10 |
| 4,376,300 | 3/1983 | Tsang | 365/200 |
| 4,380,066 | 4/1983 | Spencer et al. | 365/200 |
| 4,422,161 | 12/1983 | Kressel et al. | 365/200 |
| 4,441,170 | 4/1984 | Folmsbee et al. | 365/200 |
| 4,446,534 | 5/1984 | Smith | 365/96 |
| 4,480,199 | 10/1984 | Varshney et al. | 365/200 |

OTHER PUBLICATIONS

IEEE International Solid-State Circuits Conference, "Memories and Redundancy Techniques", by K. D. Wise, ISSCC 81, Session VIII, Feb. 18, 1981, pp. 79–85.
IBM Technical Disclosure Bulletin, "Maximized LSSD Test I/O Pin Usage", by W. P. Whitley, vol. 24, No. 2, Jul. 1981, pp. 1193–1194.

*Primary Examiner*—Felix D. Gruber
*Attorney, Agent, or Firm*—Staas & Halsey

[57] ABSTRACT

A semiconductor integrated circuit which includes therein at least one inspection circuit for inspecting a voltage level produced at an internal node to be inspected. The inspection circuit has at least a control signal input portion connected to the internal node to be inspected and an input part connected to an external input/output pin. The inspection circuit includes a series-connected transistor and diode connected between a power source and the input portion, a capacitor connected between a gate of the transistor and the input portion, and a transfer gate transistor connected between the control signal input portion and the gate of the transistor. The inspection circuit discriminates the level at the internal node according to a flow or nonflow of a current, via the external input/output pin, when a particular signal having a voltage level higher than the power source level is supplied to the external input/output pin.

6 Claims, 6 Drawing Figures

SEMICONDUCTOR INTEGRATED CIRCUIT

BACKGROUND OF THE INVENTION

(1) Field of the Invention

The present invention relates to a semiconductor integrated circuit (IC), more particularly to an IC in which a status of a node in an internal circuit thereof can be inspected through an external input/output pin thereof.

(2) Description of the Prior Art

The increasingly higher densities of packing of IC's have led to the evolution of large-scale integrated circuits (LSI) and very large-scale integrated circuits (VLSI). LSI's and VLSI's contain enormously large numbers of circuits. Accordingly, there is an extremely high probability that several defective circuit elements are created during the wafer processes. Naturally, it is not desirable, in view of the wafer process yield, to discard an entire chip containing, for example, several hundred thousand circuit elements, due to the creation of a handful of defective circuit elements.

To improve the yield, manufacturers usually fabricate a redundancy circuit in advance in the chip. Therefore, if they find defective circuit elements during their probing tests of the chip, they use the redundancy circuit to function for the defective circuit elements. This enables a remarkable improvement in the manufacturing yield of the chip. This method is widely used for a variety of IC products, such as semiconductor memory devices.

The introduction of a redundancy circuit into a chip enables large numbers of IC's which might otherwise have been discarded to be saved, even though they may contain one or more defective circuit elements. On the other hand, IC's with redundancy circuits suffer from certain problems. That is, after the IC chips are completely packaged, it is impossible to determine whether the redundancy circuit has been used or is still unused. It is, of course, possible to determine this by disassembling the IC's, however, such disassembled IC's could not be used commercially.

IC manufacturers must be able to know whether packaged IC's contain a used redundancy circuit or an unused redundancy circuit in order to cope with complaints from the user. For example, in random write-/read operation tests for IC memory devices, the results of the tests may differ according to whether a circuit element (for example a memory cell), specified by certain address input, is located at its originally intended position or has been replaced by a redundancy circuit.

One proposal to solve this problem calls for the use of an idle external input/output pin, electrically connected to the circuit elements, for discriminating whether the IC contains a used or unused redundancy circuit. In actuality, however, and particularly in the case of an LSI or VLSI, there is almost never an idle external input/output pin. Consequently, the proposal is not practical.

SUMMARY OF THE INVENTION

It is an object of the present invention to provide an IC in which the use or non-use of a redundancy circuit can be inspected electrically and externally from the IC package. It is a further object of the present invention to provide an IC in which a status of a particular internal node can be inspected electrically and externally from the IC package.

The above object can be attained by an IC including an inspection circuit. The inspection circuit has at least an input portion and a control signal input portion. A node to be inspected in an internal circuit is connected to the control signal input portion. The status at the node to be inspected causes electrical fluctuation at the input part of the inspection circuit. The electrical fluctuation is measured by one of the external input/output pins, which is commonly used for communication of signals during normal operation of the packaged IC.

BRIEF DESCRIPTION OF THE DRAWINGS

The present invention will be more apparent from the ensuing description with reference to the accompanying drawings, wherein.

DESCRIPTION OF THE PREFERRED EMBODIMENT

Figure 1A:
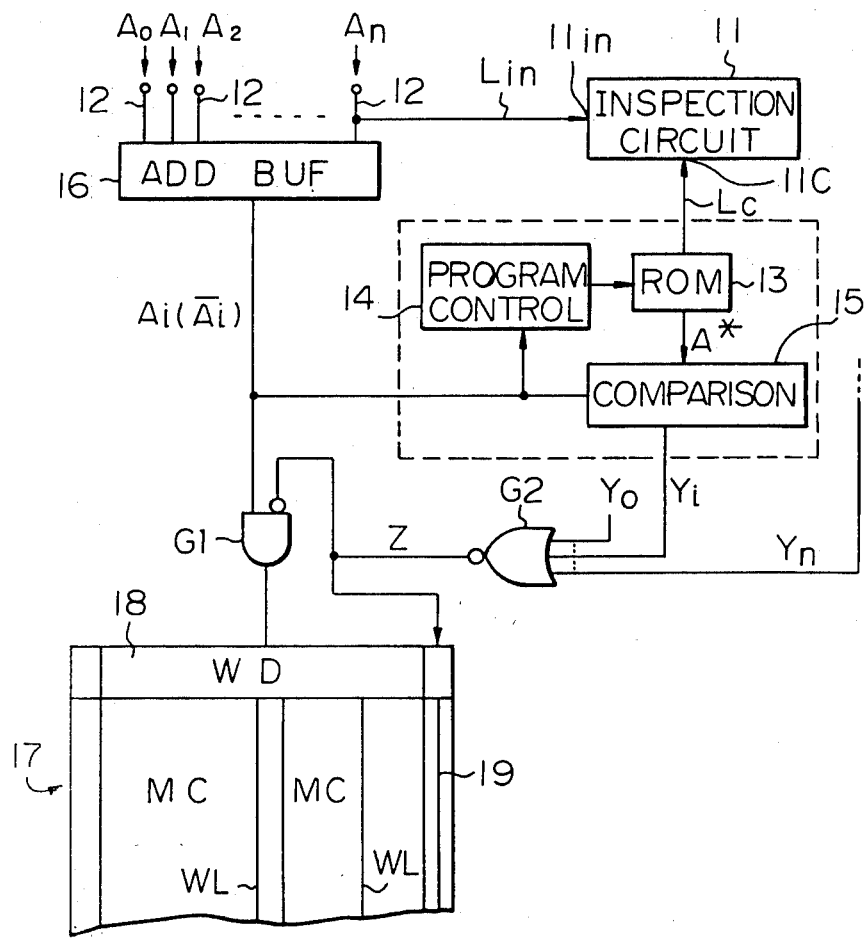
FIG. 1A is an overall view of a semiconductor memory device as an embodiment according to the present invention.

FIG. 1A is an overall view of a semiconductor memory device as one example to which the present invention is adapted. The present invention is particularly characterized by an inspection circuit 11. An input portion $11_{in}$ of the inspection circuit 11 is connected via a line $L_{in}$ to one of external input/output pins 12 for common use. An on-off control signal input portion $11_c$ of the inspection circuit 11 is connected via a line $L_c$ to an output of a ROM circuit 13. These members 11, $11_{in}$, $11_c$, $L_{in}$, and $L_c$ are newly employed according to the present invention.

Since the example of FIG. 1A is a semiconductor memory device, the external input/output pins 12 serve for dealing with address inputs $A_0$, $A_1$, $A_2$, ... $A_n$ between the inside and outside of the packaged IC. The address inputs $A_0$ through $A_n$ are introduced inside the IC chip through an address buffer (ADD BUF) circuit 16. It should be understood that only the i-th bit (i.e., $A_i$) of n address input bits is shown in FIG. 1A for brevity. The address input bit $A_i$ (or $\overline{A}_i$) is applied via an AND gate G1 to a word decoder (WD) 18 of a semiconductor memory 17 to access the desired one of memory cells MC's. In this figure, the symbol WL represents word lines. It should also be understood that, although only AND gate G1 is illustrated, there are in all, n number of identical AND gates corresponding to the number of bits. Further, blocks 13, 14, and 15 which are enclosed by broken lines, are only used for bit $A_i$.

The AND gate G1 is normally open, but closes every time the address input specifies a defective circuit element, i.e., a defective memory cell MC, because, when the defective memory cell is accessed, it must be replaced by a redundancy circuit element, i.e., a redundancy word line 19.

Whether the accessed circuit element is defective or not, that is, whether the redundancy circuit must be used or not, is determined during the probing test of the wafer after completion of the manufacturing process. Thereafter, program control is performed by a circuit 14 according to the results of the probing test. The program control circuit 14 operates to turn on a transistor in the ROM 13 corresponding to a transistor located at an address corresponding to the address specifying the defective memory cell. Thus, the corresponding fuse element is fused by a fusing current externally supplied via the on transistor.

An address signal A* corresponding to the fused fuse element in the ROM 13 is applied to a comparison circuit 15. The comparison circuit 15 receives the specified address input bit $A_i$ ($\overline{A_i}$), and, thereby, a predetermined comparison logic operation is executed therebetween. A resultant output $Y_i$ produced from the comparison logic operation has either the logic level "1" or "0" depending upon the logic levels of the inputs $A_i$ and A*, as shown in the following table. It should be noted that the output $Y_i$ relates only to the address input bit $A_i$ and that there are in all n number of outputs $Y_0$ through $Y_n$ for the bits of the address input $A_0$ through $A_n$, respectively.

TABLE

| $A_i$ | A* | $Y_i$ |
|---|---|---|
| 0 | 0 | 0 |
| 0 | 1 | 1 |
| 1 | 0 | 1 |
| 1 | 1 | 0 |

As seen from the table, the comparison circuit 15 executes an EXOR (exclusive OR) operation of both $A_i$ and A*. The resultant outputs $Y_0$ through $Y_n$, including $Y_i$, are applied to a NOR gate G2 so as to produce an output Z therefrom. The output Z can be represented by the following logical expression.

$$Z = \overline{Y_0 + Y_1 + \ldots + Y_i + \ldots Y_n}$$

This expression means that if Z="0", normal address selection is achieved, because, according to the above recited expression, at least one of the outputs ($Y_0$ to $Y_n$) indicates logic level "1", that is, the specified address is not exactly the same as the ROM address. However, if Z="1", the redundancy circuit element is used, because, in this case, all of the outputs ($Y_0$ to $Y_n$) indicate logic "0", that is, the specified address is exactly the same as the ROM address. When Z="1", the AND circuit G1 is closed and the redundancy circuit element, i.e., the redundancy word line 19, is activated.

The above-mentioned operation of switching to the redundancy circuit element by using a fuse-ROM is known by "Memories and Redundancy Techniques", pages 79 through 81, 84 and 85, given before Session VIII of ISSCC 81, Feb. 18, 1981.

Figure 1B:
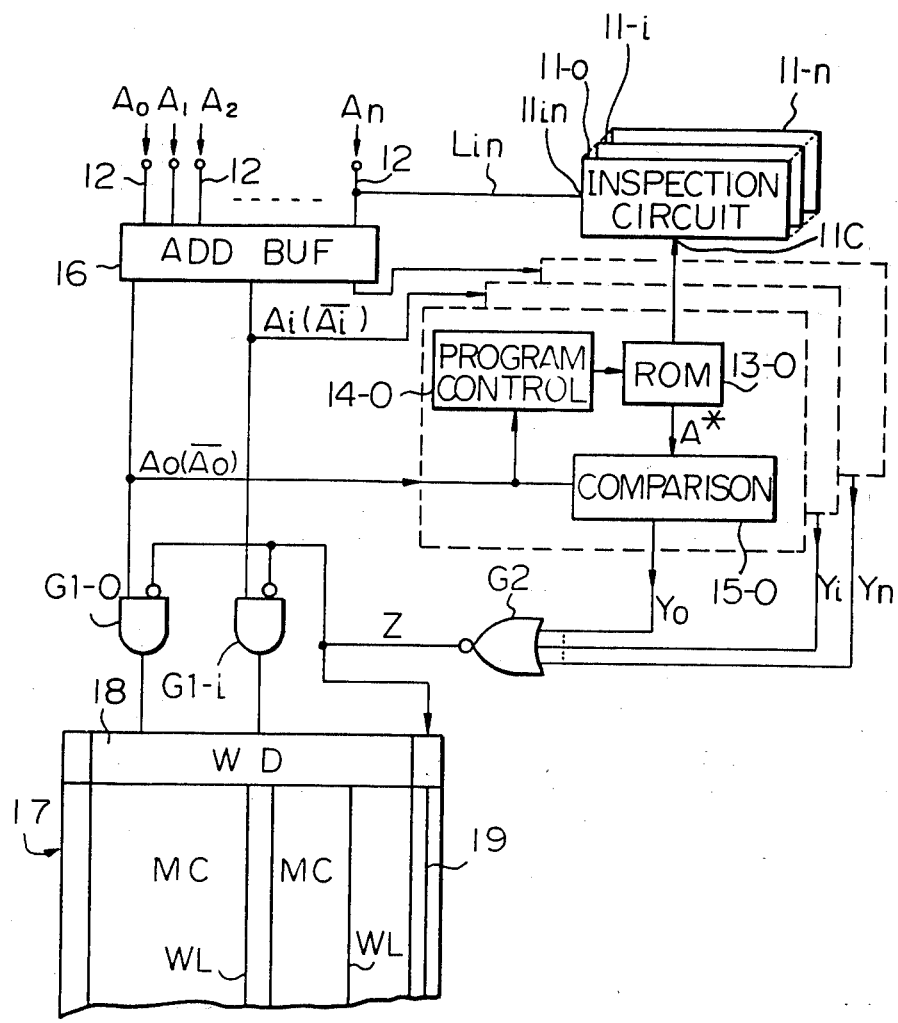
FIG. 1B is a more detailed overall view of the semiconductor memory device shown in FIG. 1A.

FIG. 1B is a more detailed overall view of the semiconductor memory device shown in FIG. 1A. As previously mentioned, in FIG. 1A, only members 11, 13, 14, 15 and G1 corresponding to the i-th bit of the address input $A_0$ through $A_n$ are illustrated for brevity, and, members identical thereto exist for each bit of the address input. FIG. 1B shows the identical members not illustrated in FIG. 1A.

Figure 2:
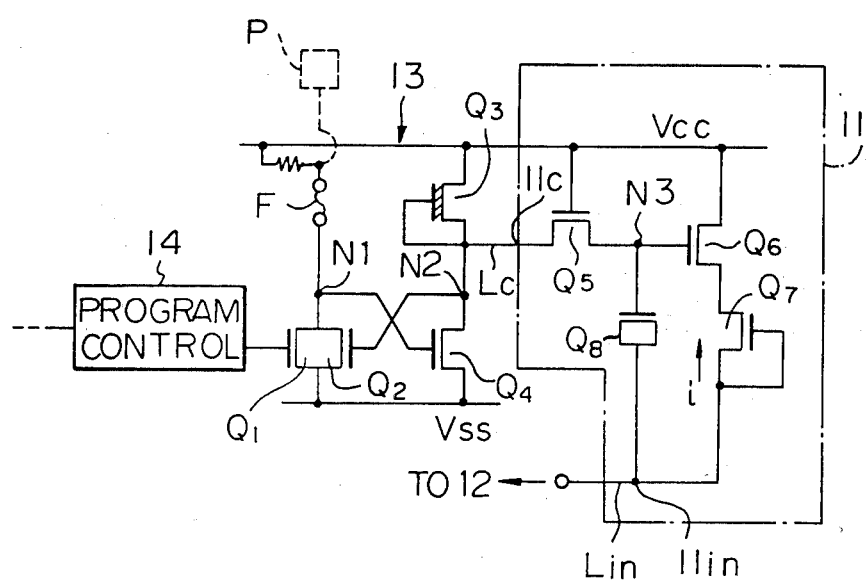
FIG. 2 is a circuit diagram of an embodiment of an inspection circuit according to the present invention in combination with a known read only memory (ROM) circuit and a program control circuit.

As previously mentioned, in FIG. 1A, the present invention is mainly directed only to the inspection circuit 11. FIG. 2 is a circuit diagram of an example of the inspection circuit according to the present invention in combination with the known ROM circuit 13 and the program control circuit 14 shown in FIG. 1A. The inspection circuit 11 and the ROM 13 are connected to a power source having a level of $V_{cc}$. The ROM 13 is connected to ground having a level of $V_{ss}$. $V_{cc}$ and $V_{ss}$ are common to the same chip. The external input/output pin 12, the lines $L_{in}$, $L_c$, the input part $11_{in}$ and the on-off control signal input part $11_c$, also shown in FIG. 1A, are located at the positions indicated in FIG. 2. The aforementioned fuse element is represented by a symbol F. The element F is fused when the redundancy circuit element, for example, the redundancy word line 19 in FIG. 1A, is used. In FIG. 2, however, a nonfused element F is illustrated.

The function of the inspection circuit 11 is mainly to enable simple discrimination, outside of the packaged IC, of the existence or nonexistence of the fuse element F, i.e., the use or non-use of the redundancy circuit element, by way of a specified external input/output pin.

When the redundancy circuit element is not used, the fuse element F exists as it is. Accordingly, an internal node N1 is at an "H" (high) level, and a transistor $Q_4$ is turned on. Therefore, an internal node N2 to be inspected is at an "L" (low) level. The "L" level at the internal node N2 to be inspected is applied via the line $L_c$ to the on-off control signal input part $11_c$ and further appears, via a transfer gate transistor $Q_5$, at an internal node N3. During the inspection, a high voltage signal of, for example, $V_{cc}+2$ V (=7 V), is supplied via the external input/output pin 12 and the line $L_{in}$, to the input portion $11_{in}$ of the inspection circuit 11. The high voltage signal tries to forcibly raise the level at the node N3 via a capacitor $Q_8$ which is fabricated for example, as a gate insulation between a source and a drain of a field effect transistor. However, the node N3 is maintained at the "L" level because the transistors $Q_4$ and $Q_5$ are on. As a result, a transistor $Q_6$ cannot be turned on, and a current i cannot flow through a diode $Q_7$. Thus, the nondetection of a current i in the external input/output pin 12 when a high voltage signal is supplied to the input portion $11_{in}$ means that the fuse element F exists as it is. This in turn means that the redundancy circuit element is not used.

When the redundancy circuit element is used, the fuse element F does not exist. This is because a transistor $Q_1$ is turned on by the program control circuit 14 and a fusing current, supplied to a pad P, flows through the element F and the conductive transistor $Q_1$ to ground $V_{ss}$. Thus, the element F is fused in this case. Accordingly, the node N1 is at an "L" level and the transistor $Q_4$ is turned off. Thus, the node N2 is at an "H" level via a depletion-type transistor $Q_3$, illustrated with hatchings in FIG. 2 to distinguish it from the other enhancement-type transistors. The "H" level of the node N2 to be inspected is applied via the line $L_c$ to the on-off control signal input part $11_c$ and further appears, via the transistor $Q_5$, at the node N3. During the inspection, the aforementioned high voltage signal is supplied via the external input/output pin 12 and the line $L_{in}$ to the input part $11_c$. In this case, the high voltage signal succeeds in raising the level at the node N3 via the capacitor $Q_8$. Thereby, the transistor $Q_6$ is turned on, and the aforesaid current i flows through the diode $Q_7$. Thus, detection of a current i in the external input/output pin 12 when a high voltage signal is supplied to the input portion $11_{in}$ means that the fuse element F does not exist.

This, in turn, means that the redundancy circuit element is used.

Figure 3A:
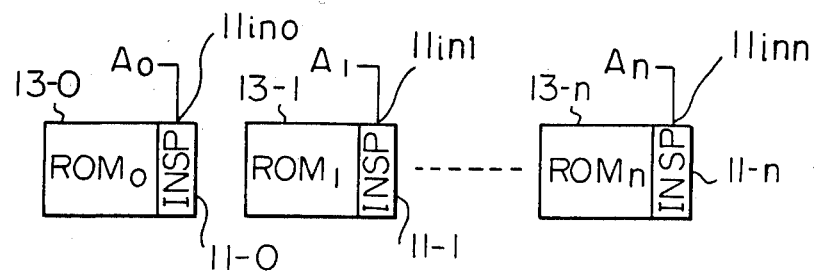
FIGS. 3A, 3B, and 3C are schematic diagrams of three different patterns of the connection between a ROM circuit and inspection circuit.
Figure 3B:
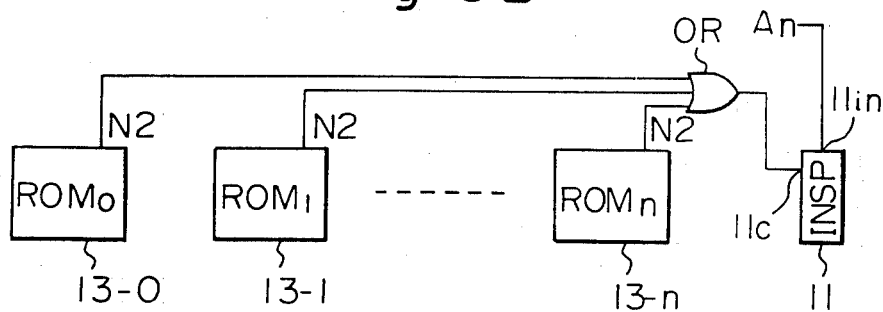
Figure 3C:
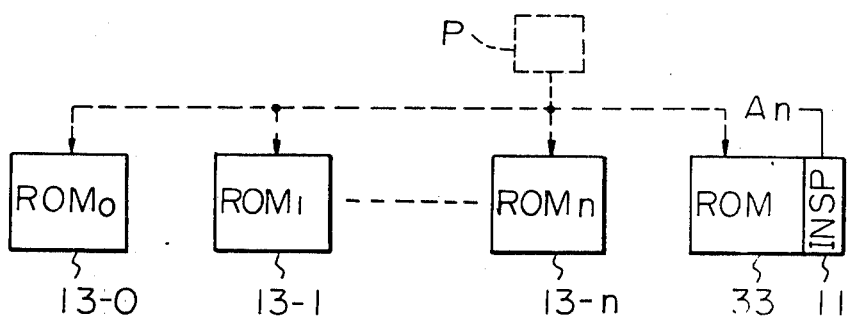

FIGS. 3A, 3B, and 3C are schematic diagrams of three different patterns for explaining the connection between the ROM circuit 13 and inspection circuit 11 shown in FIG. 1A.

In FIG. 3A, the ROM circuits 13-0, 13-1 ... 13-n exist for each bit of the address input $A_0, A_1 ... A_n$, respectively. The ROM circuits 13-0, 13-1 ... 13-n are provided with inspection circuits 11-0, 11-1 ... 11-n, respectively. In the first pattern, it is possible to discriminate not only whether the redundancy circuit element is used or not used, but also for which address the redundancy circuit element is used or not used.

In FIG. 3B, the voltage levels occurring at the nodes N2 to be inspected in the ROM circuits 13-0, 13-1 ... 13-n are collected and applied to an OR gate OR which performs an OR logic operation between these voltage levels. The output obtained from the OR gate is supplied to the control signal input portion $11_c$ of the inspection circuit 11. In the second pattern, it is not clear for which bit the redundancy circuit element is used or not used. It is clear, however, whether the redundancy circuit element is used for at least one of the bits or not used for any of the bits. This second pattern has the advantage that only one inspection circuit is needed.

In FIG. 3C, an inspection ROM circuit 33 is employed. When one or more of the fuse elements F (in FIG. 2) are fused, a fuse element in the ROM circuit 33 is fused simultaneously. The advantage of the second pattern is also enjoyed by the third pattern.

The above descriptions were made in reference to a redundancy circuit element cooperating with a ROM circuit. It should be noted, however, that from a general purpose viewpoint, the inspection circuit of the present invention can be used generally for inspecting the status of a particular internal nodes, such as the node N2 in FIG. 2. For example, the inspection circuit may be used for inspecting the status of a node in a multistage logic gate circuit of an IC. If the inspection of a node in the middle of the logic gate stages shows the expected voltage level, it may be concluded that there is no trouble in the preceding logic gate stages along a stream of data logic. If the expected voltage level is not shown, it may be concluded that there is trouble.

As explained above in detail, the status of an internal node in a circuit of a packaged IC can easily be determined externally therefrom.

We claim:

1. A semiconductor integrated circuit including therein at least an internal node to be inspected, at which node either ground level or a power source level is produced, and including a plurality of external input/output pins, said semiconductor integrated circuit comprising:
at least one inspection circuit for discriminating the level of the power source level or ground level produced at the internal node, according to a flow or non-flow of current via the external input/output pins when a particular signal having a voltage level higher than the power source level is supplied to the external input/output pins, said inspection circuit comprising:
  a control signal input portion operatively connected to the internal node to be inspected;
  an input portion operatively connected to a particular one of said plurality of external input/output pins;
  a transistor operatively connected to the power source level, said transistor having a gate;
  a diode operatively connected in series with said transistor and said input portion;
  a capacitor operatively connected between the gate of said transistor and said input portion; and
  a transfer gate transistor operatively connected between said control signal input portion and the gate of said transistor.

2. A semiconductor integrated circuit as set forth in claim 1, wherein the particular signal has a voltage level higher than the power source level by substantially 2 V.

3. A semiconductor integrated circuit as set forth in claim 1, wherein when n (where n is an integer greater than 2) internal nodes exist in the semiconductor integrated circuit, n inspection circuits are provided for the internal nodes, said inspection circuits being independently connected to respective external input/output pins through which said inspection circuits are adapted to receive the higher voltage level signal.

4. A semiconductor integrated circuit as set forth in claim 3, operatively connected to receive input information, further comprising a read only memory operatively connected to said control input portion of said inspection circuit, said read only memory storing the input information and indicating that at least one of the internal nodes is a different voltage level, so that said flow or non-flow of current changes when compared to a case when all of the internal nodes indicate the same voltage level.

5. A semiconductor integrated circuit as set forth in claim 1, wherein when n (where n is an integer greater than 2) internal nodes exist in the semiconductor integrated circuit, said inspection circuit is connected to the internal nodes.

6. A semiconductor integrated circuit as set forth in claim 5, further comprising a multi-input OR gate, operatively connected to said inspection circuit, for receiving at its multi-input the voltage levels produced at the internal nodes and supplying a resultant output therefrom to said control signal input portion of said inspection circuit.

* * * * *

UNITED STATES PATENT AND TRADEMARK OFFICE
CERTIFICATE OF CORRECTION

PATENT NO. : 4,583,179

DATED : April 15, 1986

INVENTOR(S) : Takashi Horii et al

It is certified that error appears in the above-identified patent and that said Letters Patent is hereby corrected as shown below:

Column 5, line 37, delete "a".

Signed and Sealed this

Twenty-second Day of July 1986

[SEAL]

Attest:

DONALD J. QUIGG

Attesting Officer

Commissioner of Patents and Trademarks